METHOD OF MAKING ELECTRICAL CIRCUIT MODULES

Filed Nov. 13, 1962 2 Sheets-Sheet 1

INVENTOR
JAN TOBOLSKI
BY [signature]
AGENT

METHOD OF MAKING ELECTRICAL CIRCUIT MODULES

Filed Nov. 13, 1962 2 Sheets-Sheet 2

INVENTOR
JAN TOBOLSKI
BY [signature]
AGENT

3,266,125
METHOD FOR MAKING ELECTRICAL CIRCUIT MODULES

Jan Tobolski, Los Angeles, Calif., assignor to Douglas Aircraft Company, Inc., Santa Monica, Calif.

Filed Nov. 13, 1962, Ser. No. 236,903
3 Claims. (Cl. 29—155.5)

The present invention relates generally to a method for making integrated electrical circuit modules and relates more particularly to a process for making such modules incorporating pellet type electrical components.

It is well known, in contemporary manufacture of circuit modules, to achieve substantial miniaturization of electrical wiring by employing printed circuit techniques in constructing multiple circuit paths on a base material or nonconductive type of board. Prior printed circuits have taken the form of such circuit boards having individual electrical components mounted thereon with leads therefrom inserted through and electrically connected to circuitry adjacent openings in the boards. Construction and manufacture of such types of printed circuit boards require considerable time in the initial preparation of the circuit board as well as during the disposition and attachment of components thereto. Additionally, considerable inspection time is necessary to insure proper and effective electrical connections between the circuits defined on the circuit board and the leads of the individual components.

While these prior known types of printed circuit boards with attached individual components have been completely satisfactory, in most instances, and have met normal requirements for use in radios and television receivers, computers and the like, efforts toward further miniaturization and development of both passive and active integrated types of circuits have been met with many new problems. Attempts have been made physically to construct various resistive, capacitive and inductive types of components directly from the deposited or printed circuits by utilizing specifically arranged configurations of the circuit. In some instances, these methods have proved successful; however, they have not resulted in appreciably reducing the size of printed circuits and their attached components.

Still further efforts toward miniaturization of such integrated circuits have been employed involving the use of multiply deposited thin films on a base material and the creation of components through interaction between the deposited films. Such structures are contemporarily in development stages and may prove to be satisfactory for certain purposes; however, the cost of producing such integrated structures is necessarily relatively high.

With the development of electrical components having a physical size and shape that is extremely small, as compared to more conventionally electrical components, it has now been possible to produce integrated circuits of both the passive and active types on a substantially reduced scale. One type of such components is available and constructed in a pellet shaped form. These components range in physical size from less than 1/16" to approximately 1/4" in diameter and have a length in the order of 1/32", this length being comparable to the thickness of many printed circuit boards. Components of this pellet type are generally cylindrical and have single or multiple contact planar ends of a metallic material providing surfaces to which electrical connections may be made. Pellet types of components are available from several manufacturers and include resistors, capacitors, inductors, semiconductor diodes and transistors, all within the normal range of values.

In utilizing these pellet type components in association with printed circuits, it has been common practice first to construct the printed circuit with holes provided at locations where the pellet type components are to be installed. These components have been thereafter placed in the holes and temporarily retained therein by means of a glue or other suitable resinous material, with ends of the components being exposed and positioned substantially contiguous with the surfaces of the circuit board. The printed circuits have been arranged for passage about or termination at the holes in which the pellet components were disposed, with the planar ends of the components being attached to the circuit by means of soldering or application of electrically conductive resinous material thereto. This solder or other material was allowed to contact both the circuit and an individual end of the pellet type component to provide the necessary electrical connection therebetween. These types of circuits have also been relatively satisfactory for the purposes intended; however, many of the previously encountered problems in connection with more conventional types of printed circuits and components were still present. For example, inasmuch as the pellet type components are relatively small, difficult to handle, easily lost or inadvertently exchanged for other similar components of different values, considerable time was necessary to install such components in the holes in the boards and to provide the necessary temporary retention therein at the desired locations. Further, the preparation of the circuit boards, including the necessary provision of the holes, is time consuming and expensive. Still further, the necessity for individual electrical connection of each end of the component to adjacent printed circuits has been time consuming and difficult to accomplish, and the delicate nature of the components has caused numerous failures of such components due to the necessity for or inadvertent application of excess heat thereto during the soldering process. In these prior assembly techniques for the pellet type components, the problems associated with the quality of soldered connections, as well as the necessity for provision of controls to insure that all necessary solder connections are made, still remain, thus to perpetuate assembly techniques that are similar in time consumption, cost and the like to those associated with the assembly of printed circuits with individual types of conventional electronic components with wire type leads.

Contemporary trends in development, use and manufacture of integrated circuits lean toward the creation of such circuits with the intention that any problems associated therewith be eliminated by complete replacement of the circuit module. However, in some instances, it is desirable to enable repair of such circuits. Additionally, it is often necessary to utilize electronic components having values or current ratings that are substantially greater than those that may successfully be handled by pellet type components. Accordingly, during an interim period of time until ultimate creation and use of true integrated, non-repairable circuit modules, as a bridge during this time and possibly thereafter, hybrid types of circuits are being employed combining miniaturized pellet type components as well as the more conventional components of larger size and electrical values.

In accordance with the present invention, therefore, means are provided for enabling an assembly of the pellet type components in conjunction with printed or etched types of circuits while eliminating substantially all of the problems described hereinbefore and associated with either conventional types of printed circuits with individual components, or present in heretofore known assembly techniques for pellet type components.

The beforementioned problems are eliminated, in accordance with the present invention, by, in general, attaching sheets of electrically conductive material to ends of pellet type components disposed and temporarily retained with ends thereof in substantially common planes, hereby to "sandwich" the components between these sheets of material. The sheets of material further serve to define an area therebetween that is partially occupied by the components, this area being thereafter filled with a non-electrically conductive material which normally becomes, or is cured to, a solid state. The sheets of conductive material thus define surfaces of a module, with portions of these sheets being thereafter removed intermediate at least a portion of the ends of the components as by normal and well-known printed circuit manufacturing techniques to define desired circuit interconnections for and between the pellet components. The resulting circuit module appears similar to an ordinary printed circuit board with the circuits substantially concealing the components now essentially buried in the board. Thus, no external obstructions are presented, enabling close stacking of the boards and permitting substantial size reductions in multiple board assemblies.

It is therefore one important object of the present invention to provide improved integrated electrical circuit modules including a method for making such modules.

It is another important object of the invention to provide a method for making integrated electrical circuit modules wherein all connections to pellet type components incorporated therewith are made substantially simultaneously, and problems associated with prior known assembly techniques relating to pellet type components and printed circuits are essentially eliminated.

Still another object of the invention is to provide a method for making integrated electrical circuit modules incorporating pellet type electrical components wherein such method enables relatively inexpensive, efficient, rapid and reliable manufacture of such circuit modules.

Another important object of the invention is to provide an improved means for attaching, positioning and maintaining pellet type components in conjunction with printed or etched types of circuits.

Another object of the invention resides in the provision of an integrated circuit that may be repaired by substitution or replacement of pellet components therein.

A further object of the invention is to provide a method for making integrated electrical circuit modules incorporating pellet shaped electrical components and wherein the resulting module presents no exterior irregularities due to either the presence of the components or any attachment means therefor to printed circuits.

It is another object of the invention to provide a method for making printed circuitry for use with pellet components, the resulting module being compatible with more conventional components to produce a hybrid electronic module.

Other and further important objects of the present invention will become apparent from the disclosures and following detailed specification, appended claims and accompanying drawings, wherein:

With reference to the drawings, wherein the various steps of the present process for making integrated electrical circuits incorporating the pellet components are illustrated, and wherein diagrammatic sectional views are provided to illustrate construction during the various steps, the disclosed process is shown as being employed to produce a circuit module that has the general appearance of the relatively well-known printed circuits, although the pellet components are appropriately positioned and connected while being at least partially obscured in a supporting base structure or board.

Figure 1:
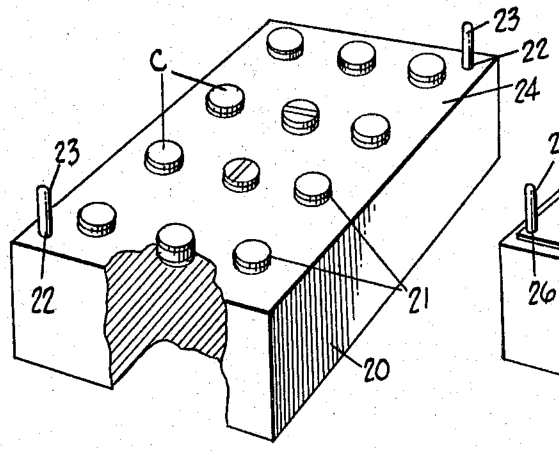
FIGURE 1 is a perspective view, partially diagrammatic, illustrating a means for temporarily retaining a plurality of pellet components in desired locations.

As shown in FIG. 1, a plurality of the pellet components, indicated at C, are temporarily retained in desired physical locations by means of a block 20, in which a plurality of spaced recesses 21 are formed. The recesses 21 are substantially all the same depth, thus to dispose end surfaces of the components C in substantially common planes. While the spacing and position of the recesses 21 are shown in FIG. 1 as being regular and uniform, it is to be understood that these locations are merely for illustrative purposes and that in actual practice, the locations will be as required for particular circuits. The block 20 is further provided with recesses 22 in which alignment pins 23 are freely disposed which, like the components C, extend above an upper surface 24 of the block 20. While the pins 23 are shown as being rod-like members, these may be also tubular. The purpose of the alignment pins 23 will be hereinafter more fully described.

Figure 2:
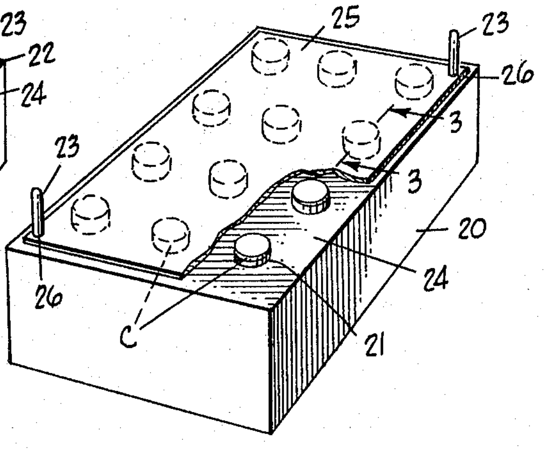
FIG. 2 is a perspective view similar to FIG. 1 showing the application of a sheet of conductive material to common end surfaces of the plurality of pellet components.
Figures 3, 4, 5:
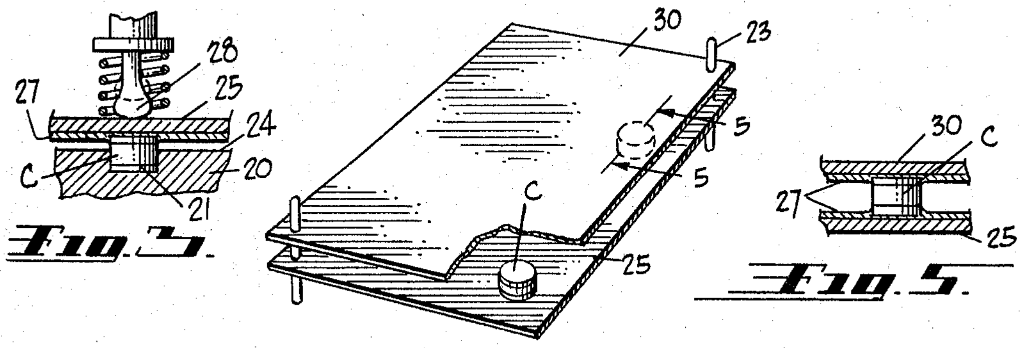
FIG. 3 is an enlarged, fragmentary, sectional view taken substantially as indicated by line 3—3, FIG. 2.
FIG. 4 is a perspective view illustrating a further step in the process wherein a pair of sheets of conductive material are attached to opposite ends of the plurality of pellet components.
FIG. 5 is an enlarged, fragmentary, sectional view taken substantially as indicated by line 5—5, FIG. 4 and showing one manner of attachment of the pellet components to the sheets of conductive material.

As shown in FIG. 2, a sheet of electrically conductive material, indicated at 25, is provided with openings 26 through which the pins 23 are disposed, whereby transversely to align the sheet 25 with the components C. The sheet 25 is thereafter attached to one of the common ends of each of the components C. In order to effect such attachment, one method which may be employed includes the coating of one side of the sheet 25 with a solder layer or coating. Thereafter, the side of the sheet having the solder layer is positioned in contact with the common ends of the components C and either local or generally distributed heat is applied to the uncoated side of the sheet whereby to cause the sheet to be soldered to the common ends of the components. The particular construction following this step in the present process is illustrated in FIG. 3, wherein the solder layer or coating is illustrated at 27 and is shown as providing the desired attachment between the components C and the conductive sheet 25. The conductive sheet 25 may be of any desired material as, for example, metallic copper, and may be in the order of .002" in thickness. The heating of the solder layer may also be accomplished in any desired manner as, for example, with a plurality of individual spring loaded soldering iron tips 28 which may be as illustrated in FIG. 3. In this connection, care is exercised to supply only sufficient heat to effect a proper solder joint between the sheet 25 and the ends of the components C to prevent possible injury to or destruction of the components. In addition to attaching the components C to the sheet 25, the pins 23 are also attached to sheet 25 as by soldering, for example.

As illustrated in FIG. 4, the sheet 25 is raised upwardly from the block 20, carrying with it the attached components C and alignment pins 23. This subassembly is then inverted to the position illustrated in FIG. 4 and a second sheet of conductive material 30, similar to the sheet 25 and similarly coated with solder, is attached to the opposite common ends of the components C. Alignment of the sheet 30 is also accomplished by the pins 23. The attachment of the sheet 30 to the components C may be accomplished in a manner similar to that described in connection with the attachment of the sheet 25 to the components C. An illustration of the resulting condition of the subassembly thus created is illustrated in FIG. 5 wherein a component C is shown as being attached, as by soldering and utilizing the solder layers 27 carried by the sheets 25 and 30. It is to be noted that the sheets 25 and 30 are shown, for clarity, having an exaggerated thickness, as proportionally compared to the size of the component C. In actual practice, the spacing between the inner adjacent surfaces of the sheets 25 and 30 will be in the order of $\frac{1}{32}''$, this spacing being substantially less than or equal to the normally encountered thickness of printed circuit boards.

Figures 6, 7, 8:
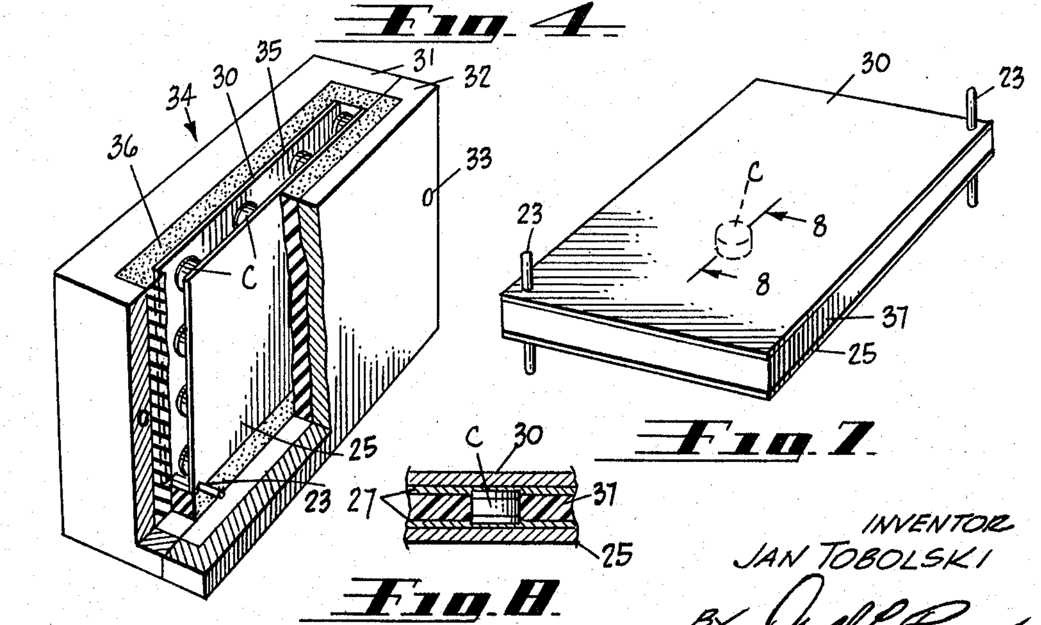
FIG. 6 is a perspective view showing a manner for confining edges of the assembly illustrated in FIG. 4 to enable filling of the area between the sheets of conductive material with a non-conductive material.
FIG. 7 is a perspective view illustrating a partially completed circuit module as it appears upon removal from the confining fixture illustrated in FIG. 6.
FIG. 8 is an enlarged, fragmentary, sectional view through the assembly illustrated in FIG. 7 and taken substantially as indicated by line 8—8, FIG. 7.

In order to complete the assembly, the partially completed module, as illustrated in FIG. 4, is disposed in a fixture as illustrated generally in FIG. 6. The fixture of FIG. 6 is in the form of a split mold having portions 31 and 32 which may be aligned and secured together by means of pins 33. The mold, as indicated generally at 34, has a cavity 35 that may be provided with a resilient liner 36 which may be of rubber or any other suitable resilient material which serves as a parting material for the non-conductive material which is disposed therein. The split mold enables disposition of the partially completed assembly within the cavity 35 with the alignment pins 23 being disposed in suitable openings. The cavity 35 serves to confine peripheral edges of an area defined between adjacent inner surfaces of the sheets 25 and 30 with this area being partially occupied by the component C. The cavity 35 is appropriately shaped to conform to the shape of the sheets 25 and 30. Thereafter, a non-electrically conductive material is disposed in the area between the sheets 25 and 30 while the partially assembled module is retained in the fixture 34. This material may be any suitable non-conductive material in either a liquid or granular form that may be solidified as by heating or used with a suitable catalyst to effect curing of the material. For example, an epoxy type resin of the epichlorohydrin diphenylolpropane resin type, reacting with an amine acid hardener, may be used. This material becomes solid within an appropriate time and upon solidification, the partially completed module is removed from the fixture 34 and appears as indicated in FIG. 7, the solidified resinous material being indicated at 37 and completely filling the area between the sheets 25 and 30 and surrounding and tightly engaging the components C therebetween. The material 37 is also such as to form a bond between the material and the sheets 25 and 30 or the solder layer thereon. As shown in FIG. 8, the assembly includes the sheets 25 and 30, with the solder layers 27, and the components C attached to the sheets by means of the solder layers, and further with the solidified resinous material 37 filling the area between the sheets and surrounding the components.

Figures 9, 10:
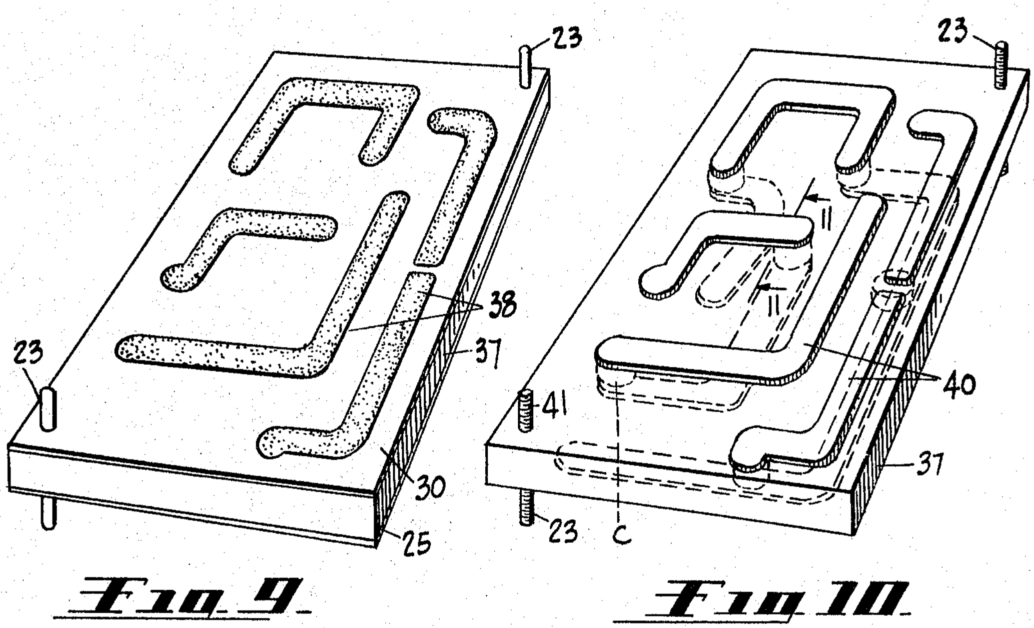
FIG. 9 is a perspective illustration of the assembly of FIG. 7 having an acid etch resist material applied to exposed surfaces of the conductive sheets of material.
FIG. 10 is a perspective illustration showing a completed integrated circuit module made in accordance with the process of the present invention.
Figure 11:
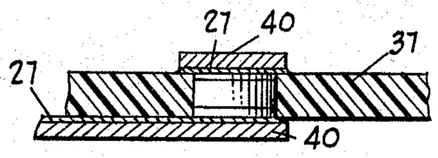
FIG. 11 is an enlarged, fragmentary, sectional view taken substantially as indicated by line 11—11, FIG. 10.

Following solidification of the non-electrically conductive material 37, the alignment pins 23 are utilized as a means for locating and aligning templets, masks or projected images representing desired circuitry, whereby to establish the pattern of the desired printed circuit interconnections for and between the components C. The printed circuit may be constructed by any of the well-known techniques as, for example, as illustrated in FIG. 9, through application of a suitable acid etch resist to the outer exposed surfaces of the sheets 25 and 30. For example, strips or layers of cold top enamel, indicated at 38, may be employed which will serve to cover certain selected areas of the outer exposed surfaces of the sheets 25 and 30. The entire assembly may thereafter be disposed in a suitable acid etching solution whereby to etch away the material of the sheets 25 and 30 and the solder layers thereunder, except in the areas appropriately covered by the cold top enamel 38. The enamel is thereafter removed, thus leaving printed circuit strips, as indicated at 40 in FIG. 10, interconnecting the components C, surfaces of the solidified non-conductive material 37 now being partially exposed and establishing a base or board for supporting the interconnecting strips 40 of the circuit. The module thus constructed is generally as shown diagrammatically in FIG. 10, it being noted that no protuberances or solder joints or the like are presented on the exterior surface of the module whereby to permit stacking of a plurality of modules in spaced side-by-side relationship. The alignment pins 23 may either be trimmed or removed or may be alternately suitably threaded as at 41 for use as a means for attaching adjacently disposed circuit modules made in accordance with the present invention. By using tubular alignment pins, adjacent modules may be interconnected by an elongated rod disposed through the tubes. The construction of the completed module surrounding a component C is generally as indicated in the enlarged sectional view of FIG. 11, it being noted that the printed circuit strips now indicated at 40 are bonded to the base or board material 37 as described earlier in the process and during the curing or solidifying of the material 37, the solder 27 providing an interface between the material 37 and the strips 40 as well as providing the attachment means between these strips and the components C.

Figure 12:
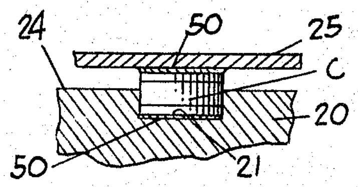
FIG. 12 is a sectional view similar to FIG. 3 and illustrating a modified method for attaching the pellet components to the sheets of conductive material.

As shown in FIG. 12, other methods may be utilized in practicing the present invention and for attaching the components C to the conductive sheets disposed on each side thereof. In this further example, the components C are disposed in the recesses 21 in the block 20 in the manner described hereinbefore; however, in this instance, planar ends of the components C are precoated with layers of solder indicated at 50 on each end thereof. Such pre-coating may be accomplished, for example, by dipping of the components in liquid solder or by applying preformed solder discs to the component ends. Thereafter, the sheet 25, as well as the sheet 30, are attached to the individual components in a manner similar to that described hereinbefore by local or general application of heat to the exterior surface of the sheets of conductive material in areas overlying each end of each component C.

Figure 13:
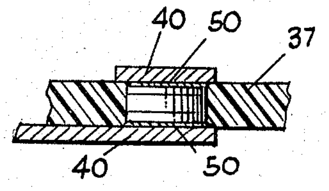
FIG. 13 is a sectional view similar to FIG. 11 showing a completed interconnection between a printed circuit and a pellet component incorporating the modified process step illustrated in FIG. 12.

As shown in FIG. 13, the completed circuit utilizing the process step of FIG. 12 is similar to that described hereinbefore; however, the base material will be of a slightly greater thickness, the increase over the previously described process step being the result of the combined thicknesses of the solder layers 50. In this instance, the conductive strips 40, providing a portion of the printed circuit, will be similar to that illustrated in FIGS. 10 and 11.

It may thus be seen that the present process for making electrical circuit modules enables rapid, efficient and reliable production of such modules incorporating the pellet type electrical components, these components being essentially buried and obscured within the body or board of the module, as defined by the non-conductive material disposed between and filling the area between the conductive sheets of material 25 and 30. The problems heretofore associated with either conventional printed circuits and more conventional components, as well as those problems described hereinbefore associated with prior known techniques for utilizing pellet components, are thus eliminated. While the resulting circuit, defined by the strips 40, is shown as interconnecting a portion of the components C, it will be recognized that various configurations of the circuit may be used depending upon the desired electrical characteristics thereof. Additionally, all or a portion of these conductive strips may extend to one or more edges of the created circuit board to permit use of the circuit in association with elongating connectors in a plug-in manner. The particular construction thus achieved through the process of the present invention also provides a circuit module that is extremely rugged in that all components are maintained in a rigid manner, thus substantially reducing the possibility of damage thereto or fracture of soldered joints between these components and the circuit strips due to environmental shock, vibration, thermally changing conditions or corrosive elements.

It may further be seen that the ultimate integrated circuit module produced by the present process may be easily repaired to enable substitution or replacement of a component. The changing of a component is accomplished by merely removing the component by punching or drilling and thereafter inserting a new component. Attachment of this newly inserted component may be accomplished by soldering or otherwise attaching the end conducting plates or discs thereof to the printed circuit strips adjacent to the drilled or punched hole.

In another instance, hybrid types of circuit modules may be incorporated with the present integrated circuit module arrangement, as produced by the process of the present invention, by punching or drilling holes in appropriate areas of the circuit strips through which the leads of the more conventional types of components may be inserted and thereafter soldered or otherwise attached in conventional manners.

Having thus described the invention and the present several embodiments of the process hereof, it is desired to emphasize the fact that many further modifications and alternate steps may be resorted to in a manner limited only by a just interpretation of the following claims:

I claim:

1. The process for making integrated electrical circuit modules incorporating pellet type electrical components comprising the steps of:

employing the use of a template which positions and temporarily retains said components in a desired pattern with the ends of said components being disposed in parallel first and second spaced planes, said first spaced plane of component ends being accessible;

placing a first heat conductive sheet in contact with said first plane of component ends, said sheet including a layer of solder, said solder being in direct contact with the ends of said components;

heating a portion of said sheet to the extent of soldering together said sheet and said contacting component ends forming a unitary unit;

removing said unitary unit from said template making said second plane of component ends accessible;

placing a second heat conductive sheet having a layer of solder thereon in contact with said second plane of component ends, heating said second sheet to the extent of soldering together said second sheet and said component ends located in said second plane;

said resultant unit defining an area intermediate said first and second sheets, said area being partially occupied by said components;

placing the resultant unit into a mold thereby allowing entry to said area through only one edge of said resultant unit;

completely filling said unoccupied area with a liquified, normally solid non-electrically conducting material;

solidifying said conducting material;

removing the unit from the mold; and removing selected portions of said sheets from said non-electrically conducting material, remaining portions of said sheets defining electrical interconnections for said components.

2. The process according to claim 1 wherein said removal of selected portions of said sheets is by acid etching.

3. The process according to claim 2 wherein said acid etching is limited to said selected portions of said sheets by an acid resist material.

References Cited by the Examiner

UNITED STATES PATENTS

| | | | |
|---|---|---|---|
| 2,947,150 | 8/1960 | Roeder | 136—4.2 |
| 2,997,514 | 8/1961 | Roeder | 136—4.2 |
| 3,084,391 | 4/1963 | Parstorfer | 29—155.5 |
| 3,086,281 | 4/1963 | Shockley et al. | 29—423 X |

FOREIGN PATENTS

| | | |
|---|---|---|
| 223,544 | 3/1958 | Australia. |
| 811,755 | 4/1959 | Great Britain. |
| 824,347 | 11/1959 | Great Britain. |

JOHN F. CAMPBELL, *Primary Examiner.*

C. I. SHERMAN, W. I. BROOKS, *Assistant Examiners.*